US006285585B1

(12) United States Patent
Kurihara et al.

(10) Patent No.: US 6,285,585 B1
(45) Date of Patent: Sep. 4, 2001

(54) OUTPUT SWITCHING IMPLEMENTATION FOR A FLASH MEMORY DEVICE

(75) Inventors: Kazuhiro Kurihara, Sunnyvale; Tien-Min Chen, San Jose, both of CA (US)

(73) Assignee: Advaned Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/421,471

(22) Filed: Oct. 19, 1999

(51) Int. Cl.$^7$ .................................... G11C 14/00
(52) U.S. Cl. ................... 365/185.08; 365/233.5; 365/189.05
(58) Field of Search ................... 365/233.5, 203, 365/185.08, 185.25, 189.05, 185.33, 194

(56) References Cited

U.S. PATENT DOCUMENTS

| | | | |
|---|---|---|---|
| 5,263,000 | 11/1993 | Buskirk et al. | 365/226 |
| 5,291,446 | 3/1994 | Buskirk et al. | 365/189.09 |
| 5,612,921 | 3/1997 | Chang et al. | 365/226 |
| 5,708,387 | 1/1998 | Cleveland et al. | 327/536 |
| 5,841,696 | 11/1998 | Chen et al. | 365/185.11 |
| 5,847,998 | 12/1998 | Buskirk | 365/185.33 |
| 5,867,430 | 2/1999 | Chen et al. | 365/189.04 |
| 5,995,430 | * 11/1999 | Yabe | 365/203 |
| 6,005,803 | 12/1999 | Kuo et al. | 365/185.11 |
| 6,016,270 | 1/2000 | Thummalapally et al. | 365/185.11 |
| 6,111,787 | * 8/2000 | Akaogi | 365/233.5 |

OTHER PUBLICATIONS

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.

AMD, Technology Background brochure, "3.0 Volt–only Page Mode Flash Memory Technology,"
AMD, Technology Background brochure, "3.0 Volt–only Burst Mode Flash Memory Technology."
AMD, Technology Background brochure, "AMD DL160 and DL320 Series Flash: New Densities, New Features."
Intel Corporation, "Common Flash Memory Interface Specification", Release 1.1, May 30, 1997.
AMD, "Common Flash Memory Interface Publication 100—Vendor & Device ID Code Assignments", Jul. 25, 1996, vol. 96.1.
AMD "Am29DL162C/AM29DL163C 16 Megabit (2 M×8–Bit/1 M×16–Bit) CMOS 3.0 Volt–only, Simultaneous Operation Flash Memory", Publication 21533, Rev: C Amendment/+2, Jul. 14, 1999.
Intel Corporation, "1.8 Volt Intel® Dual–Plane Flash Memory 28F320D18 (×16)", Product Review Datasheet, Order Number: 290672–002, Oct. 1999.
Macronix International Co., Ltd. "MXIC Advance Information MX29VW160T/B—16M–Bit [2M×8–Bit/1M× 16–BIT] Simultaneous Read/Write Single 2.5V Operation Flash Memory", P/N:PM0567, Rev. 0.8, May 17, 1999.
ATMEL Corporation, "ATMEL® 16–megabit (1M×16/2M× 8) 3–volt Only Flash Memory", Rev. 0925H–08/99.
STMicroelectronics, "M59DR032A, M59DR032B, 32 Mbit (2Mb×16, Dual Bank, Page) Low Voltage Flash Memory", preliminary data, Oct. 1999, pp. 1–38.

(List continued on next page.)

*Primary Examiner*—A. Zarabian
(74) *Attorney, Agent, or Firm*—Wagner, Murabito & Hao LLP (57) ABSTRACT

An output buffer control circuit for a simultaneous operation flash memory device is disclosed. The output buffer control circuit receives signals indicating when an equalization or address transition detect phase of operation is happening and blocks the output enable input signal from reaching the output buffers of the memory device. This prevents the output buffers from switching.

26 Claims, 3 Drawing Sheets

OTHER PUBLICATIONS

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

"AMD News Release #9879", obtained at the internet address http://www.amd.com/news/prodpr/9879.html.

"Intel® 1.8 Volt Dual–Plane 32–Mbit Flash Memory (D18)", obtained at the internet address http://www.intel.com/design/flcomp/prodbref/298131.htm, Nov. 18, 1999.

* cited by examiner

OUTPUT SWITCHING IMPLEMENTATION FOR A FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-fictional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modem flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, in one aspect of the present invention, an output buffer control circuit for a simultaneous read/write capable flash memory device is provided which blocks the output enable signal from the output buffers during the equalization or address transition detect phases of operation of the memory device. In another aspect of the present invention, the output buffer control circuit prevents the output buffers from switching during the equalization or address transition detect phases of operation of the memory device.

This has the advantages that electrical noise created by some circuits on the integrated circuit, which may cause interference with other circuits, is reduced. Noise is unwanted electrical or electromagnetic energy that degrades the quality of signals and data. The output buffer control circuit is designed to minimize overall electrical noise generated by the flash memory device and eliminate electrical noise generated by the output buffers of the device during critical data sensing operations.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M ×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

Figure 1:
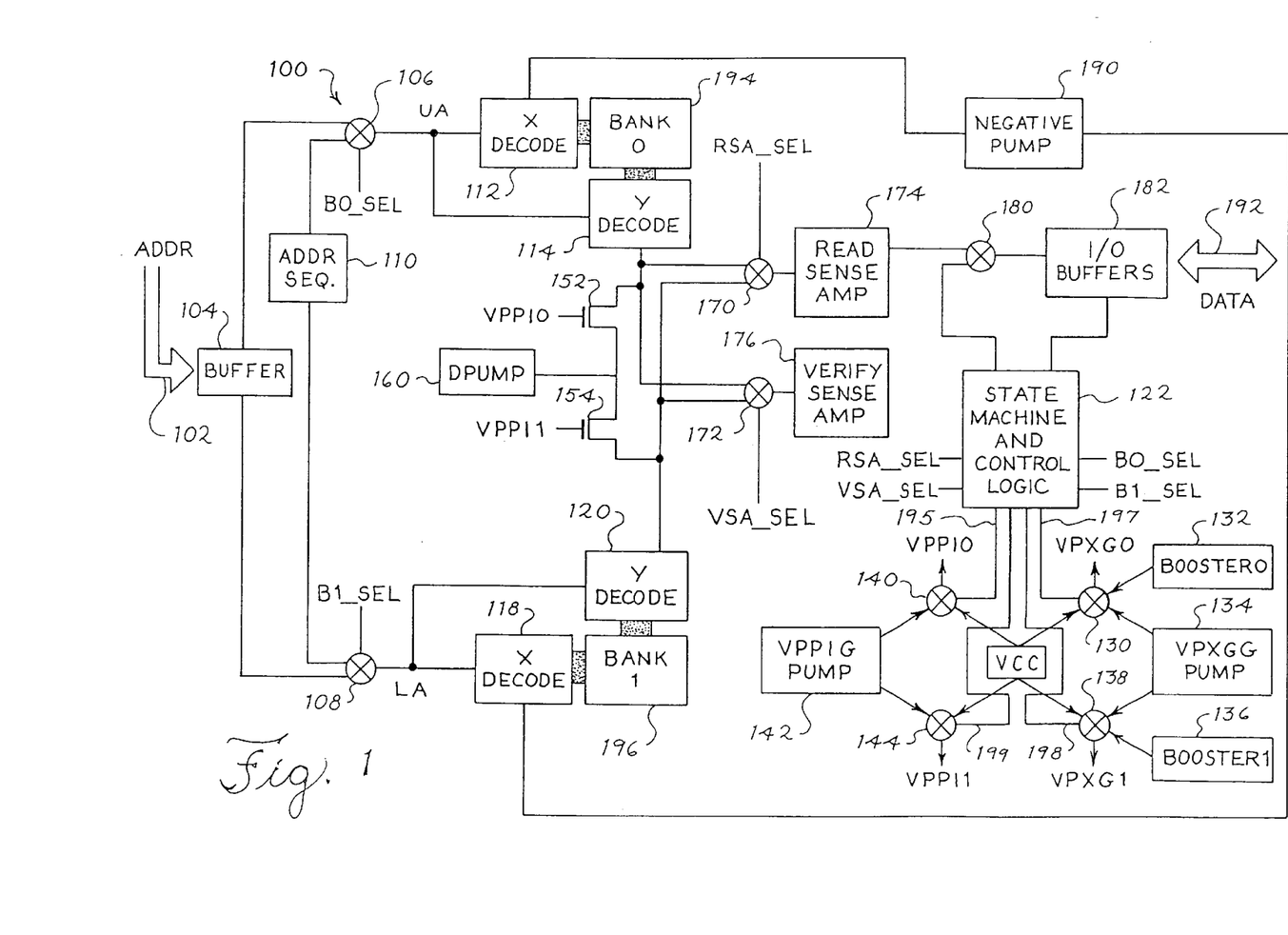
FIG. 1 depicts a block diagram of a flash memory chip according to the present invention that is capable of simultaneous reading and writing.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 11 0 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent Application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,023, "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

On the flash memory device 100, as discussed above, high voltages are used during the memory cell program and erase operations. These high voltages are much higher than those used to represent the digital signals used by the logic circuits of the memory device 100. The presence of these high voltages can cause electrical interference or noise in those digital signals and may cause interference with other circuits.

It will be appreciated that there may be many sources of electrical noise within the memory device 100. For example, the output buffers 182 may generate noise when amplifying the input current signal to a level that can be used outside the memory device 100.

Another possible source of noise from the output buffers 182 comes from the fact that most of the circuits on the memory device 100 implement digital logic functions which are continually switching their logical values. These abrupt logic value changes can generate abrupt changes in the voltages received by the output buffers 182 and cause noise. Noise is generated in these circuits because signals passing among the circuits, while representing logical 0's and 1's, and in some cases, a third high impedance state, are actually varying voltages . The logical 0's and 1's are actually implemented as voltage levels. For example, approximately 5 volts may represent a logical 1 while approximately 0 volts represents a logical 0. In the preferred embodiment, a logical 1 can be implemented as 3 volts or 2 volts depending on the desired operating voltage and a logical 0 may be implemented as 0 volts. As the signals to be output from the chip change from logical 0 to logical 1 and vice versa, the amplified output swings from the low voltage representing the 0 to the high voltage representing the 1 and vice versa.

These frequent swings from a relatively low voltage to a high voltage and back again, with the accompanying boost in current, across as many as 16 output buffers 182 can cause a significant amount of electrical noise. It is therefore advantageous to minimize or even eliminate as much of this noise as possible.

Figure 2:
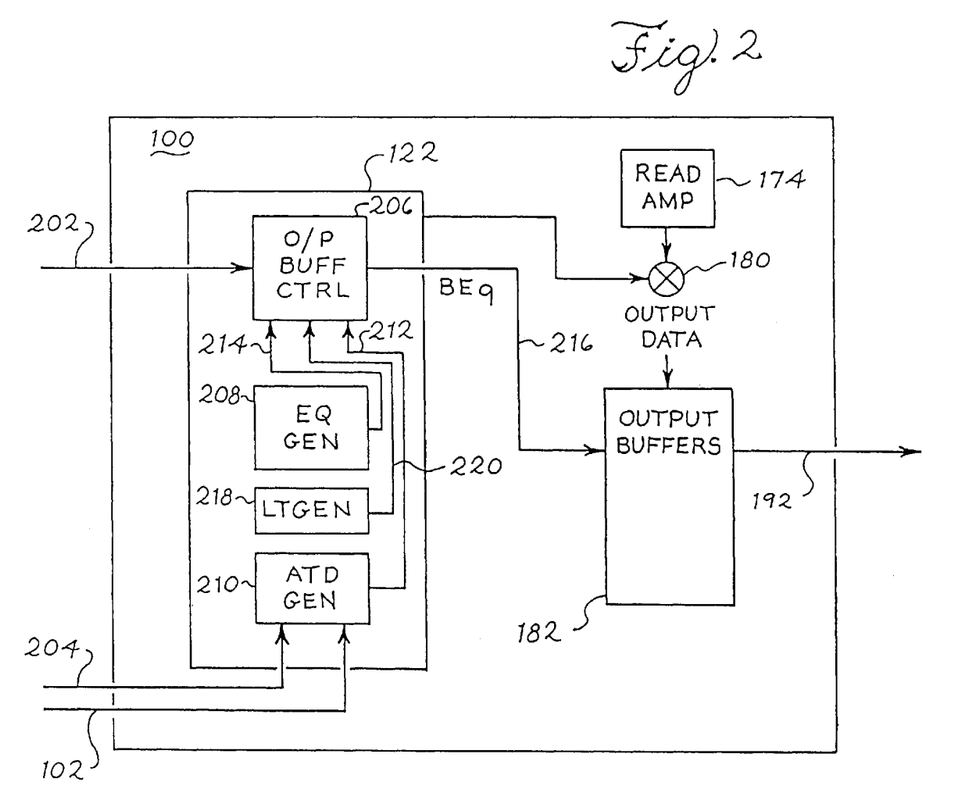
FIG. 2 depicts a simplified block diagram of the flash memory chip of FIG. 1 showing a preferred implementation of an output buffer control.

In one embodiment of the present invention, an output buffer control circuit is provided. Referring to FIG. 2, there is shown a preferred embodiment for the state machine and control logic 122 to control an output buffer 182 for use with the memory device 100 of FIG. 1. For the sake of clarity, a number of components in FIG. 1 have been deleted in FIG. 2. The device 100 further includes inputs for an output enable signal 202 (labeled "$\overline{OE}$" or "OEB", the bar indicates that this signal is asserted/active-low meaning a logical 0 on the input signifies that it is asserted and activates the output buffers), and a chip enable input 204 (labeled "$\overline{CE}$"). The state machine and control logic 122 further includes an output buffer control circuit 206, an equalization pulse generator 208, a latch signal generator 218, and an address transition detect signal generator 210.

The address transition detect signal generator is connected to the chip enable input 204 and the address inputs 102. This circuit generates a signal 212 whenever it detects that either of these inputs changes. The equalization pulse generator 208 generates a signal which equalizes the output of the differential sense amplifiers 174, 176 while the memory array data is being sensed from the memory banks 194, 196. The equalization pulse generator 208 also generates a signal 214 to indicate when this equalization is being done. The latch signal generator generates 218 a latch signal 220 to activate output buffers after the equalization phase completes.

The output buffer control circuit 206 is connected to the output enable input 202 and also receives the address transition detect signal 212, the equalization generator signal 214 and the latch signal 220. This circuit 206 is described in more detail below. The output buffer control circuit 206 also includes an output for a buffer enable signal 216 which connects to each of the output buffers 182. The output buffers 182, under control of the buffer enable signal, output data to the chip output pins 192. This data either comes from the state machine and control logic 122 or the read sense amplifiers 174 via the multiplexer 180. For more detail, see the discussion above in connection with FIG. 1. In the memory device 100, there are 16 output buffers 182 and 16 output buffer control circuits 206.

Figure 3:
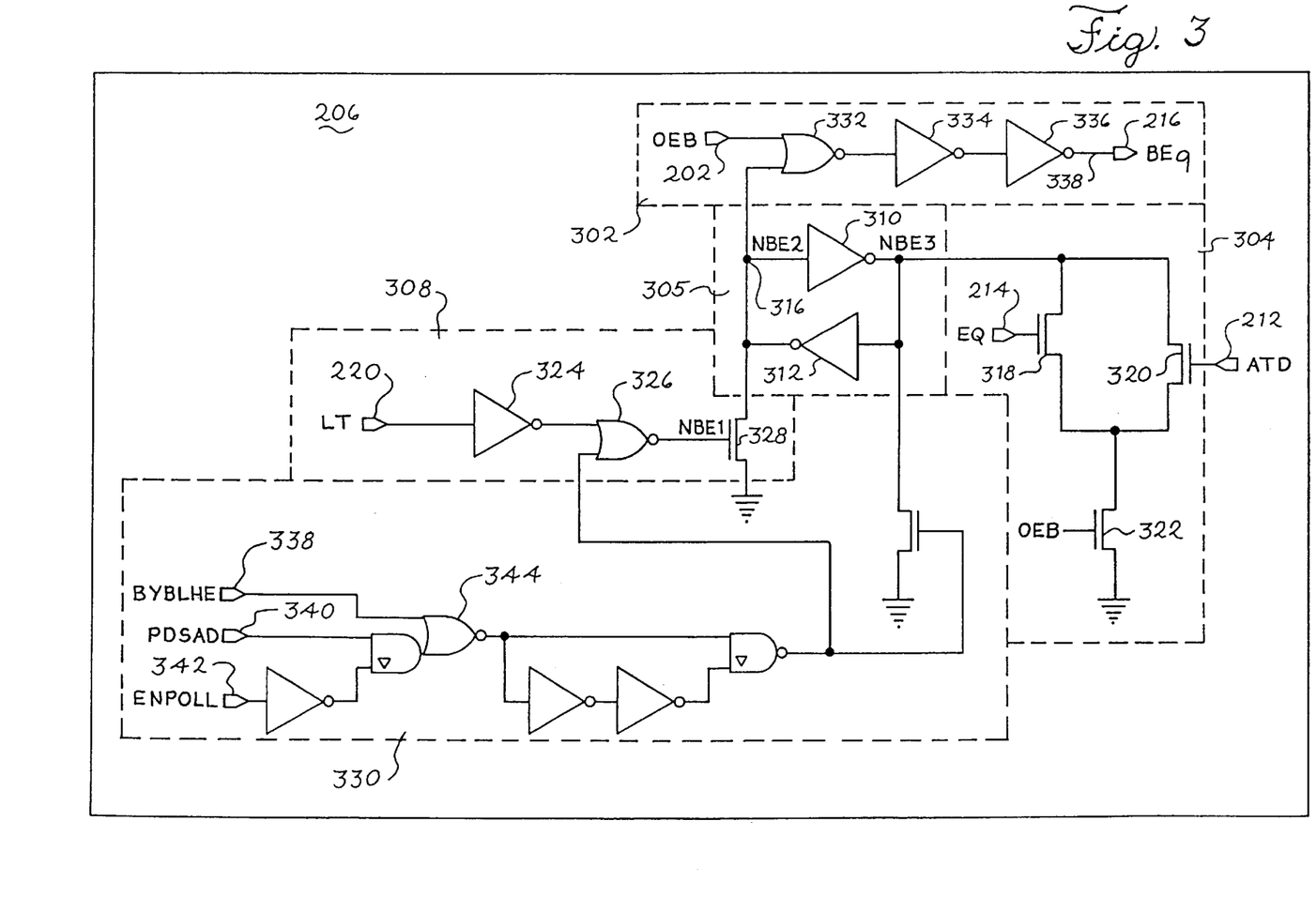
FIG. 3 depicts a schematic diagram of an output buffer control circuit for use with the flash memory chip of FIG. 3.

Referring now to FIG. 3, there is shown the preferred output buffer control circuit 206. This circuit 206 includes a transmission circuit 302, a latch set circuit 304, a latch 306 and a latch release circuit 308. The latch 306 includes two inverters 310 and 312 which are connected in a feedback configuration. The latch 306 has an input 314 (labeled "NBE3") connected to the latch set circuit 304 and an output 316 (labeled "NBE2") connected to the latch release circuit 308 and the transmission circuit 302. The inverter configuration 310 and 312 is such that when a 0 logical value is placed on the input 314, the latch will read a 1 logical value on the output 316. It will be appreciated that there are many ways to build the latch 306.

The latch set circuit 304 includes inputs for the equalization generator signal 214 and the address transition detect signal 212. These signals connect to n-channel transistors 318 and 320. The latch set circuit 304 further includes an input for the output enable signal 202 which connects to n-channel transistor 322. If output enable signal 322 is unasserted at the same time that either the equalization signal 214 or the address transition detect signal 212, is asserted transistors 322 and 318 or 320 will turn on connecting the input 314 of the latch 306 to ground. This effectively will set the latch 306 to a logical 1 value. Note that as used herein, the word "asserted" in reference to a signal means the state of that signal which is considered significant. For example, a signal which is active-low is asserted when there it is a logical 0 and unasserted when it is a logical 1. It is the opposite for active-high signals.

The latch release circuit 308 includes an inverter 324 which receives the latch signal 220 from the latch signal generator 218. The inverter 324 connects to a NOR gate 326 and then to n-channel transistor 328. The NOR gate 326 also has an input for a mode control circuit 330. When the latch signal 220 is asserted (a logical 1), a zero logical value is placed on NOR gate 326. If the mode control circuit is de-asserted (logical 0), then the NOR gate 326 will place a logical 1 value on the transistor 328, turning it on. This connects the output 316 of the latch 306 to ground which effectively unsets the latch 306.

The transmission circuit 302 includes a NOR gate 332 which connects to the output enable signal 202 and the output 316 of the latch 306. The circuit 302 further includes inverters 334 and 336 and an output 338 for the buffer enable signal 216. If the latch 306 is set to a logical 1 value, the output of the NOR gate 332 will stay at a logical 0 value no matter what the state of the output enable signal 202. This effectively puts a logical zero on the buffer enable signal 216 output 338. If the latch 306 is unset to a logical 0 value, the output of the NOR gate 332 will vary with the value of the output enable signal 202. Effectively, the transmission circuit 302 will then pass the current value of the output enable signal 202 to the buffer enable signal 216.

The buffer control circuit 206 then responds to the equalization generator signal 214 and the address transition detect signal 212 such that when either signal is received when the output enable signal 202 is asserted, the latch 306 will set to block the output enable signal 202 from reaching the output buffers 182. Once the equalization phase or address transition detect phase of operation finish, the latch signal generator 218 asserts the latch signal 220 to release the latch 306 and allow the output enable signal 202 to activate the output buffers 182.

In this way, the switching of the output buffers 182 is eliminated during the critical sensing phases of equalization and address transition detect. This eliminates the electrical noise associated with the buffer switching and minimizes the overall noise generated on the device 100.

The mode control circuit 330 has inputs for a byte mode control 338 (labeled "BYBLHE"), a power down control 340 (labeled "PDSAD") and an embedded mode control 342 (labeled "ENPOLL"). These inputs 338, 340, 342 force the output buffer control circuit on or off in certain operating modes of the device 100. For example, when the device 100 is operating in byte mode, the output buffers for the high byte (upper 8 chip outputs 192) are disabled. This occurs by byte mode logic in the device 100 asserting the BYBLHE input 338. When this signal is asserted, the output of NOR gate 344 drops to zero which effectively sets the latch 316 and blocks the output enable signal 202. For the low byte output buffer control circuits, the BYBLBE input 338 is grounded. The power down control 340 is used to shut off the output buffers 182 during certain internal operations of the device such as the internal test modes. The embedded mode control 342 is used to override the PDSAD input 340 and keep the output buffers 182 operating during embedded operations.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An output buffer control circuit for a flash memory device, said circuit comprising:
   a latch operative to be set when an equalization signal is received and be set when an address transition detect signal is received;
   a latch release signal receiver for receiving a latch release signal and to operative to unset said latch upon receipt of said latch release signal; and
   an output enable transmission circuit comprising an input for receiving an output enable signal and an output for transmitting said output enable signal and wherein said output enable transmission circuit is coupled with said latch and operative to pass said output enable signal from said input to said output when said latch is unset and block said output enable signal from said input to said output when said latch is set.

2. The output buffer control circuit of claim 1, further comprising:
   an equalization signal receiver for receiving said equalization signal and said output enable signal; and
   an address transition detect signal receiver for receiving said address transition detect signal and said output enable signal;
   wherein said equalization signal receiver and said address transition detect signal receiver are coupled with said latch; and
   further wherein said equalization signal receiver is operative to set said latch when said equalization signal and said output enable signal are received and said address transition detect signal receiver is operative to set said latch when said address transition detect signal and said output enable signal are received.

3. The output buffer control circuit of claim 1, wherein said flash memory device is capable of simultaneous read/write operation.

4. An output buffer control circuit for a flash memory device, said device comprising an output enable input, said circuit comprising:
   a buffer controller coupled with said output enable input and responsive to an equalization signal and an address transition detect signal;
   an output buffer coupled with said buffer controller and said output enable input; and
   wherein said buffer controller blocks said output enable input to said output buffer when said equalization signal is asserted; and
   further wherein said buffer controller blocks said output enable input to said output buffer when said address transition detect signal is asserted.

5. The output buffer control circuit of claim 4 further comprising
   an equalizer that generates said equalization signal; and
   an address transition detector that generates said address transition detect signal.

6. The output buffer control circuit of claim 5, wherein:
   said flash memory device further comprises an address input and a chip enable input;
   wherein said address transition detector generates said address transition detect signal when said address input changes; and
   further wherein said address transition detector generates said address transition detect signal when said chip enable input changes.

7. The output buffer control circuit of claim 4 further comprising:
   a latch signal generator coupled with said buffer controller that generates a latch signal;
   wherein said buffer controller passes said output enable input to said output buffer when said latch signal generator generates said latch signal.

8. The output buffer control circuit of claim 4, wherein said flash memory device is capable of simultaneous read/write operation.

9. An apparatus for controlling noise on a flash memory device, said device comprising an output enable input and a data output, said apparatus comprising:

an output buffer coupled with said output enable input and operative to output data to said data output when said output enable is asserted;

a buffer controller coupled with said output enable input, said output buffer, and responsive to an equalization signal and an address transition signal;

said buffer controller being operative to block said output enable input to said output buffer when said equalization signal is asserted; and said buffer controller further being operative to block said output enable input to said output buffer when said address transition detect signal is asserted;

whereby electrical noise is reduced during the assertion of said equalization signal and said address transition detect signal.

10. The apparatus of claim 9 further comprising an equalizer operative to generate said equalization signal; and an address transition detector operative to generate said address transition detect signal.

11. The apparatus of claim 10, wherein:

further comprising an address input and a chip enable input;

wherein said address transition detector is operative to generate said address transition detect signal when said address input changes; and further wherein said address transition detector is further operative to generate said address transition detect signal when said chip enable input changes.

12. The apparatus of claim 9 further comprising:

a latch signal generator coupled with said buffer controller and operative to generate a latch signal;

said buffer controller being further operative to pass said output enable input to said output buffer when said latch signal generator generates said latch signal.

13. The apparatus of claim 9, wherein said buffer controller is operative to prevent said output buffer from switching.

14. The apparatus of claim 9, wherein said flash memory device is capable of simultaneous read/write operation.

15. A method of controlling electrical noise on flash memory device, the method comprising:

generating an equalization signal;

generating an address transition detect signal;

providing an output enable input to an output buffer;

blocking said output enable input to said output buffer when said equalization signal is generated;

blocking said output enable input to said output buffer when said address transition detect signal is generated;

preventing said output buffer from switching due to said blocking; and reducing noise generated within said flash memory device due to said prevention of switching of said output buffer.

16. The method of claim 15 further comprising:

passing said output enable input to said output buffer when said address transition detect signal and said equalization signal are not generated; and allowing said output buffer to switch.

17. An output buffer control circuit for a flash memory device, said device comprising an output enable input, said circuit comprising:

a buffer controller responsive to an equalization signal and an address transition detect signal;

an output buffer responsive to said output enable input; and wherein said buffer controller prevents said output buffer from switching when said equalization signal is asserted; and further wherein said buffer controller prevents said output buffer from switching when said address transition detect signal is asserted.

18. The output buffer control circuit of claim 17 further comprising an equalizer that generates said equalization signal; and an address transition detector that generates said address transition detect signal.

19. The output buffer control circuit of claim 18, wherein:

said flash memory device further comprises an address input and a chip enable input;

wherein said address transition detector generates said address transition detect signal when said address input changes; and further wherein said address transition detector generates said address transition detect signal when said chip enable input changes.

20. The output buffer control circuit of claim 17 further comprising:

a latch signal generator coupled with said buffer controller that generates a latch signal;

wherein said buffer controller enables said output buffer to switch when said latch signal generator generates said latch signal.

21. The output buffer control circuit of claim 17, wherein said flash memory device is capable of simultaneous read/write operation.

22. A method of controlling operation of an output buffer in a memory device, the method comprising:

generating a buffer enable signal when an output enable signal is asserted and a latch is unset, thereby enabling operation of said memory device output buffer;

setting said latch after said output enable signal is unasserted, thereby preventing generation of said buffer enable signal when said output enable signal is asserted; and unsetting said latch after said output enable signal is asserted, thereby generating said buffer enable signal.

23. The method of claim 22, wherein said setting step is initiated when an equalization signal is asserted.

24. The method of claim 22, wherein said setting step is initiated when an address transition detect signal is asserted.

25. The method of claim 22, wherein said unsetting step is initiated when a latch release is asserted.

26. The method of claim 25, wherein said setting step is capable of being initiated when either an equalization signal is asserted or an address transition detect signal is asserted or an address transition detect signal is asserted.

* * * * *

UNITED STATES PATENT AND TRADEMARK OFFICE
CERTIFICATE OF CORRECTION

PATENT NO.    : 6,285,585 B1
DATED         : September 4, 2001
INVENTOR(S)   : Kazuhiro Kuirhara and Tien-Min Chen It is certified that error appears in the above-identified patent and that said Letters Patent is hereby corrected as shown below:

<u>Title page,</u>
Item [73], should read as follows:
-- [73] Assignee:  Advanced Micro Devices, Inc., Sunnyvale, CA (US) and Fujitsu Limited, Kanagawa, (JP) --

Signed and Sealed this

Twenty-seventh Day of May, 2003

JAMES E. ROGAN
*Director of the United States Patent and Trademark Office*